US011411059B2

(12) United States Patent
Cheng et al.

(10) Patent No.: US 11,411,059 B2
(45) Date of Patent: Aug. 9, 2022

(54) DISPLAY SUBSTRATE MOTHERBOARD WITH BLOCKING REGION AND MANUFACTURING METHOD THEREOF, DISPLAY PANEL MOTHERBOARD AND MANUFACTURING METHOD OF DISPLAY SUBSTRATE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xuhui Cheng, Beijing (CN); Daji Wang, Beijing (CN); Yuqing Yang, Beijing (CN); Zhen Zhang, Beijing (CN); Xiping Li, Beijing (CN); Fuwei Zou, Beijing (CN); Yiyang Zhang, Beijing (CN); Huiyang Yu, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

(*) Notice: Subject to any disclaimer, the term of this patent is extended or adjusted under 35 U.S.C. 154(b) by 239 days.

(21) Appl. No.: 16/844,307

(22) Filed: Apr. 9, 2020

(65) Prior Publication Data
US 2021/0005686 A1    Jan. 7, 2021

(30) Foreign Application Priority Data
Jul. 4, 2019 (CN) .......................... 201910600149.6

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 51/0018* (2013.01); *H01L 51/56* (2013.01); *H01L 2227/323* (2013.01); *H01L 2251/566* (2013.01)

(58) Field of Classification Search
CPC combination set(s) only.
See application file for complete search history.

(56) References Cited

U.S. PATENT DOCUMENTS 10,216,023 B2  2/2019 Namkung et al.
2017/0033312 A1* 2/2017 Kim ................... H01L 51/5253
(Continued)

FOREIGN PATENT DOCUMENTS

CN       106959561 A    7/2017
CN       107561796 A    1/2018
(Continued)

OTHER PUBLICATIONS

First Office Action dated Jan. 25, 2021 for application No. CN201910600149.6 with English translation attached.

*Primary Examiner* — Nduka E Ojeh
(74) *Attorney, Agent, or Firm* — Nath, Goldberg & Meyer; Joshua B. Goldberg (57) ABSTRACT

The disclosure provides a display substrate motherboard, a manufacturing method thereof, a display panel motherboard and a manufacturing method of a display substrate. The display substrate motherboard includes a base substrate including multiple substrate areas, each substrate area including a display region and a pad region; a display structure layer located on the base substrate and including a pixel defining layer and multiple film layers located between the pixel defining layer and the base substrate, a blocking
(Continued)

region is arranged between any two adjacent substrate areas; a portion of the display structure layer in the blocking region has a first groove therein, a portion of the display structure layer between the first groove and the pad region adjacent thereto constitutes a first spacer region; a thickness of the portion of the display structure layer in the first spacer region is less than that in the display region.

14 Claims, 7 Drawing Sheets

(56) References Cited

U.S. PATENT DOCUMENTS

| 2019/0074479 | A1* | 3/2019 | Lee | H01L 51/56 |
| 2019/0153318 | A1* | 5/2019 | Park | H01L 51/5234 |

FOREIGN PATENT DOCUMENTS

| CN | 107845667 A | 3/2018 |
| CN | 108400261 A | 8/2018 |
| CN | 109449186 A | 3/2019 |
| CN | 109811345 A | 5/2019 |

* cited by examiner

FIG. 6 providing a base substrate, the base substrate including a plurality of substrate areas thereon, each of the substrate areas including: a display region and a pad region, where the pad region is located on a side of the display region along a first direction. The plurality of substrate areas are arranged in a plurality of rows and a plurality of columns. Among a plurality of substrate areas arranged in the first direction, a blocking region is provided between every two adjacent substrate areas ~S710 forming a display structure layer on the base substrate, the display structure layer including a pixel defining layer and a plurality of film layers located between the pixel defining layer and the base substrate. A first groove is formed in a portion of the display structure layer in the blocking region, and a portion of the display structure layer between the first groove and the pad region adjacent to the first groove constitutes a first spacer region. A thickness of the portion of the display structure layer in the first spacer region is less than that in the display region ~S720

DISPLAY SUBSTRATE MOTHERBOARD WITH BLOCKING REGION AND MANUFACTURING METHOD THEREOF, DISPLAY PANEL MOTHERBOARD AND MANUFACTURING METHOD OF DISPLAY SUBSTRATE

CROSS-REFERENCE TO RELATED APPLICATIONS

The present disclosure claims priority to Chinese patent publication No. 201910600149.6, filed on Jul. 4, 2019, the contents of which are incorporated herein by reference.

TECHNICAL FIELD

The disclosure relates to the field of display, in particular to a display substrate motherboard and a manufacturing method thereof, a display panel motherboard and a manufacturing method of a display substrate.

BACKGROUND

Composite transparent conductive film (e.g., ITO-Ag-ITO film) is a potential high-performance transparent conductive film, the conductivity of which is far higher than that of the traditional transparent conductive material such as indium tin oxide (ITO), and the rare element In in the ITO film can be greatly saved. In the process of manufacturing an OLED display substrate, a composite transparent conductive film is usually used to manufacture an anode of a light emitting unit.

SUMMARY

An embodiment of the present disclosure provides a display substrate motherboard, including: a base substrate including a plurality of substrate areas, each substrate area including a display region and a pad region, wherein the pad region is located on a side of the display region along a first direction; a display structure layer located on the base substrate and including a pixel defining layer and a plurality of film layers located between the pixel defining layer and the base substrate, wherein a blocking region is arranged between any two substrate areas that are adjacent to each other along the first direction; a portion of the display structure layer in the blocking region has a first groove therein, and a portion of the display structure layer between the first groove and the pad region adjacent to the first groove constitutes a first spacer region; and a thickness of the portion of the display structure layer in the first spacer region is less than that of a portion of the display structure layer in the display region.

In some implementations, the display region at least partially overlaps the blocking region in the first direction, an orthographic projection of the first groove on the base substrate traverses the blocking region in a second direction, the second direction being perpendicular to the first direction.

In some implementations, the plurality of film layers includes a gate insulating layer, an interlayer insulating layer, and a planarization layer, which are sequentially stacked in a direction away from the base substrate, wherein the first groove penetrates the gate insulating layer, the interlayer insulating layer, the planarization layer, and the pixel defining layer.

In some implementations, a thickness of a portion of the planarization layer in the first spacer region is less than a thickness of a portion of the planarization layer in the display region, and/or a thickness of a portion of the pixel defining layer in the first spacer region is less than a thickness of a portion of the pixel defining layer in the display region.

In some implementations, the display structure layer further has a second groove therein, the second groove being located between the first groove and the display region adjacent to the first groove in the first direction.

In some implementations, a portion of the display structure layer between the second groove and the first groove constitutes a second spacer region, and a thickness of the portion of the display structure layer in the first spacer region is the same as a thickness of a portion of the display structure layer in the second spacer region.

In some implementations, cross-sectional areas of the first groove and the second groove gradually decrease in a direction towards the base substrate.

An embodiment of the present disclosure provides a display panel motherboard, wherein the display panel motherboard includes the display substrate motherboard mentioned above.

An embodiment of the present disclosure provides a manufacturing method of a display substrate motherboard, including: providing a base substrate, wherein the base substrate includes a plurality of substrate areas, each of the substrate areas includes a display region and a pad region, the pad region is located on a side of the display region along a first direction, among a plurality of substrate areas arranged in the first direction, a blocking region is provided between every two adjacent substrate areas; forming a display structure layer on the base substrate, wherein the display structure layer includes a pixel defining layer and a plurality of film layers located between the pixel defining layer and the base substrate; a first groove is formed in a portion of the display structure layer in the blocking region, a portion of the display structure layer between the first groove and the pad region adjacent to the first groove constitutes a first spacer region; a thickness of the portion of the display structure layer in the first spacer region is less than a thickness of a portion of the display structure layer in the display region.

In some implementations, manufacturing the display structure layer includes: forming a planarization material layer on the base substrate; exposing and developing the planarization material layer to form a planarization layer, a portion of the planarization layer corresponding to the first groove is removed; forming a pixel defining material layer on the planarization layer; exposing and developing the pixel defining material layer to form the pixel defining layer, a portion of the pixel defining layer corresponding to the first groove is removed; wherein a thickness of the portion of the planarization layer in the first spacer region is less than a thickness of a portion of the planarization layer in the display region, and/or a thickness of the portion of the pixel defining layer in the first spacer region is less than a thickness of a portion of the pixel defining layer in the display region.

In some implementations, developing the pixel defining material layer is performed by spraying developer through a spraying device which is moved relative to the base substrate in the first direction.

In some implementations, the blocking region at least partially overlaps the display region adjacent to the blocking region in the first direction, an orthographic projection of the first groove on the base substrate traverses the blocking region in a second direction, the second direction being perpendicular to the first direction;

the manufacturing method further includes: after forming the display structure layer on the base substrate, flushing the first groove along the second direction.

In some implementations, the manufacturing method further including: forming a second groove in the display structure layer, the second groove being located between the first groove and the display region adjacent to the first groove in the first direction.

An embodiment of the present disclosure provides a manufacturing method of a display substrate, including: manufacturing a display substrate motherboard by using the manufacturing method mentioned above; cutting the display substrate motherboard along a cutting line passing through the first groove; and removing a portion of the display substrate motherboard located in the blocking region.

DESCRIPTION OF DRAWINGS

The accompanying drawings are used to provide a further understanding of the disclosure and form a part of the specification, and are used to explain the disclosure together with the following specific embodiments, but do not constitute a limitation of the disclosure. In the drawings.

DESCRIPTION OF EMBODIMENTS

The specific embodiments of the present disclosure will be described in detail below in combination with the accompanying drawings. It should be understood that the specific embodiments described herein are only used to illustrate and interpret the disclosure and are not used to limit the disclosure.

In the related art, in the process of manufacturing an anode of an OLED, metal particles (e.g., Ag particles, AgPT) are generated, and at this time, a portion of wires in a pad region of the display substrate are exposed, so that the metal particles may be attached to the exposed wires; in the development process for manufacturing subsequent film layer, by flushing with a chemical solution, the metal particles are flushed into the display region, so that dark spots and defects are caused in the display process.

Figure 1:
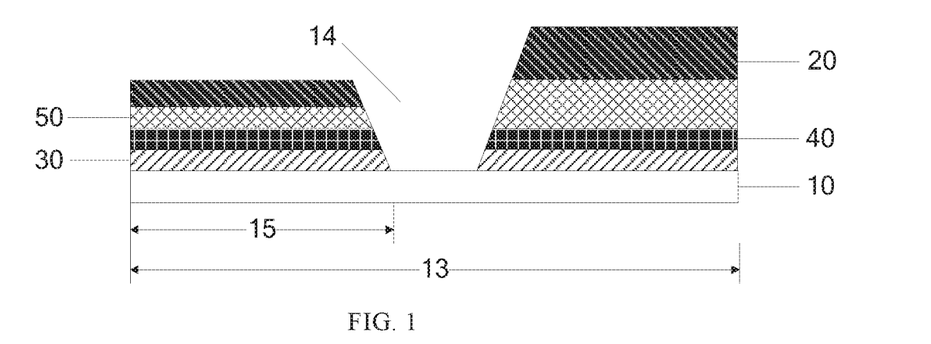
FIG. 1 is a schematic longitudinal cross-sectional view of a blocking region of a display substrate motherboard according to an embodiment of the present disclosure.
Figure 2:
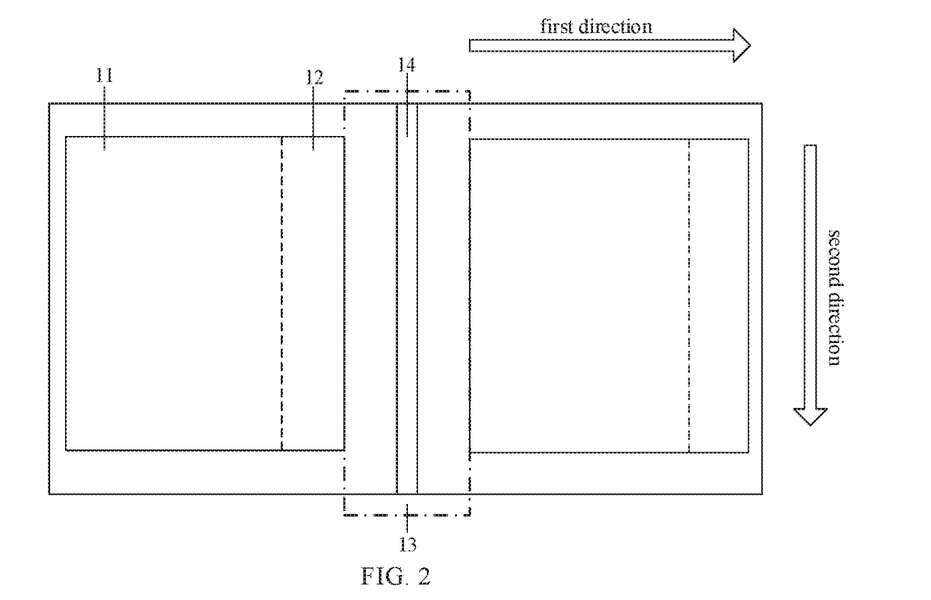
FIG. 2 is a schematic diagram showing an area division of the display substrate motherboard according to an embodiment of the present disclosure.

An embodiment of the present disclosure provides a display substrate motherboard, FIG. 1 is a schematic longitudinal cross-sectional view of a blocking region of the display substrate motherboard according to an embodiment of the present disclosure, FIG. 2 is a schematic diagram showing the area division of the display substrate motherboard according to an embodiment of the present disclosure, as shown in FIG. 1 and FIG. 2, the display substrate motherboard includes: a base substrate 10 and a display structure layer on the substrate 10. The base substrate 10 includes a plurality of substrate areas, each of which includes a display region 11 and a pad region 12, the pad region 12 being located at a side of the display region 11 in a first direction. The plurality of substrate areas are arranged in a plurality of rows and a plurality of columns. Among a plurality of substrate areas arranged in the first direction, a blocking region 13 is provided between every two adjacent substrate areas. The display structure layer includes a pixel defining layer 20 and a plurality of film layers between the pixel defining layer 20 and the base substrate 10.

A portion of the display structure layer located in the blocking region 13 is provided with a first groove 14 therein, and a portion of the display structure layer between the first groove 14 and the pad region 12 adjacent to the first groove 14 constitutes a first spacer region 15. A thickness of the portion of the display structure layer in the first spacer region 15 is less than that in the display region.

Note that the pad region 12 being adjacent to the first groove 14 means that there is not any other pad region 12 or display region 11 between the pad region 12 and a region where the first groove 14 is located.

A plurality of substrate areas (only two substrate areas are shown in FIG. 2) are arranged in the first direction on the base substrate 10, the first direction may be any one of upward, downward, leftward, and rightward directions, and specifically, the first direction is opposite to the traveling direction of the display substrate motherboard when the display substrate motherboard is flushed with a chemical solution (developer). In the embodiment of the present disclosure, the first direction is a horizontal rightward direction. As shown in FIG. 2, in any substrate area, the pad region 12 is located at the right side of the display region 11.

The pad region 12 is a region where the base substrate 10 is coupled to an external circuit. As shown in FIG. 2, a blocking region 13 is provided between the pad region 12 of the left substrate area and the display region 11 of the right substrate area. As shown in FIG. 2, a first groove 14 is provided in a portion of the display structure layer in the blocking region 13, a portion of the display structure layer between the first groove 14 and the pad region 12 of the left substrate area constitutes a first spacer region 15, and a portion of the display structure layer in the first spacer region 15 is thinned.

An electrode layer (i.e., an electrode layer formed by anodes of a plurality of light emitting units) is provided in the display region 11, and the pixel defining layer 20 is formed on a side of the electrode layer away from the base substrate 10. Before the anode of the light emitting unit is formed in the display region, a portion of the metal wires in the pad region 12 are exposed, and thus, when the anode is formed in the display region through a patterning process, metal particles generated during the patterning process are easily attached to the exposed metal wires in the pad region 12. Since the metal particles mainly stay in the pad region 12, when other structure layers are manufactured, the metal particles are flushed by the developer and flow with the developer in the development process and the like, and if a height of the portion of the display structure layer in the first spacer region 15 is consistent with a height of the portion of the display structure layer in the display region 11, the metal particles are easily flushed into the display region 11 of the adjacent display substrate, leading to a dark spot formed in the display region 11, so that the uniformity of display of the display panel is affected.

Figure 3:
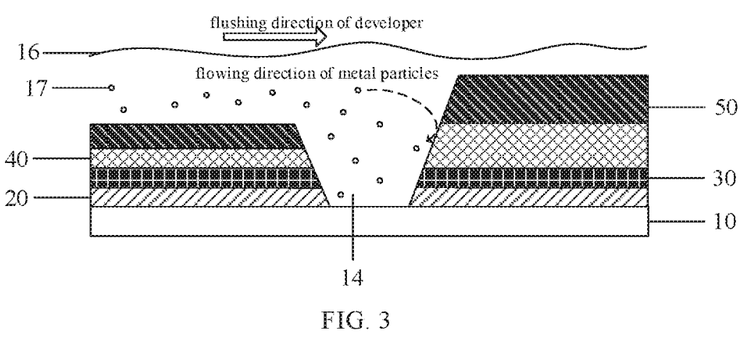
FIG. 3 is a schematic diagram showing blocking metal particles of the display substrate motherboard according to an embodiment of the present disclosure.

FIG. 3 is a schematic diagram showing blocking metal particles of the display substrate motherboard according to an embodiment of the present disclosure. As shown in FIG. 3, with the display substrate motherboard according to an embodiment of the present disclosure, when the metal particles 17 are flushed by the developer 16 to flow, the metal particles 17 are flushed from a side where the thickness of the portion of the display structure layer is relative small to a side where the thickness of the portion of the display structure layer is relative large, and since there is a gradient difference between the portion of the display structure layer in the first spacer region and the portion of the display structure layer in the display region, the flow of the metal particles 17 is blocked by a side wall of the portion of the display structure layer with relative large thickness, and the metal particles fall into the first groove 14 due to the action of gravity, so that the metal particles 17 are blocked and are prevented from entering the display region 11 of the base substrate 10, and a dark spot defect is avoided, thereby improving the uniformity of display in the display region 11.

Figure 4:
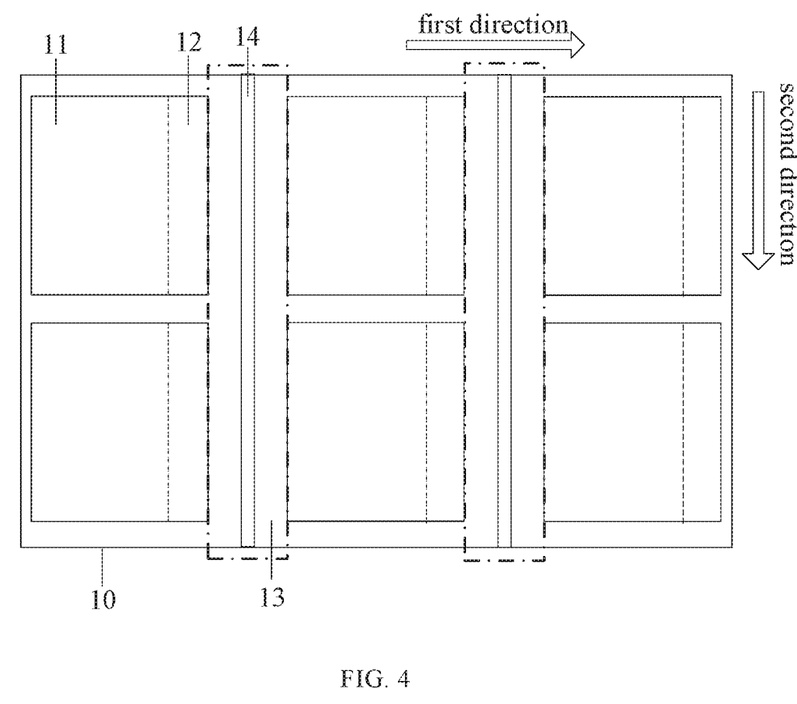
FIG. 4 is another schematic diagram showing an area division of the display substrate motherboard according to an embodiment of the present disclosure.

FIG. 4 is another schematic diagram showing the area division of the display substrate motherboard according to an embodiment of the present disclosure. As shown in FIG. 4, the display region 11 at least partially overlaps the blocking region 13 in the first direction (i.e., an orthographic projection of the blocking region 13 on the base substrate at least partially overlaps an orthographic projection of the display region 11 adjacent thereto on the base substrate), and an orthographic projection of the first groove 14 on the base substrate traverses the blocking region in a second direction, the second direction being perpendicular to the first direction.

Specifically, the second direction is perpendicular to the first direction, and may be vertically upward or vertically downward, and in the embodiment of the present disclosure, the vertically downward direction is taken as the second direction.

As shown in FIG. 4, the first groove 14 traverses the blocking region in the second direction, thereby ensuring that all the metal particles 17 generated in the display region 11 are blocked during the flushing process with the developer 16, and improving the blocking effect.

In a specific embodiment, the plurality of film layers include a gate insulating layer 30, an interlayer insulating layer 40, and a planarization layer 50 sequentially stacked in a direction away from the base substrate 10, and the first groove 14 penetrates the gate insulating layer 30, the interlayer insulating layer 40, the planarization layer 50, and the pixel defining layer 20. Each of the gate insulating layer 30, the interlayer insulating layer 40 and the planarization layer 50 covers the display region 11, a plurality of thin film transistors are disposed in the display region 11, each thin film transistor includes a gate, an active layer, a source and a drain, the active layer is disposed on a side of the gate away from the substrate 10, the gate is disposed on a side of the active layer away from the substrate 10, and the gate and the active layer are separated by the gate insulating layer 30; the source and the drain are located on a side of the interlayer insulating layer 40 facing away from the base substrate 10, and are respectively coupled with the active layer through via holes penetrating through the interlayer insulating layer 40; the anode of the display unit is located on a side of the planarization layer 50 facing away from the base substrate 10 and is coupled to the drain through a via hole penetrating through the planarization layer 50. The metal wires in the pad region 12 may be formed in synchronization with the source and the drain.

Specifically, the first groove 14 may be formed by forming an opening at the position of the first groove 14 when forming each film layer in the display structure layer. The size of the opening of the first groove 14 in each film layer in the first direction (i.e., the width in the first direction) ranges from 540 μm to 560 μm.

In a specific implementation, a thickness of a portion of the planarization layer 50 in the first spacer region 15 is less than a thickness of a portion of the planarization layer 50 in the display region 11, and/or a thickness of a portion of the pixel defining layer 20 in the first spacer region 15 is less than a thickness of a portion of the pixel defining layer 20 in the display region 11.

Specifically, when the planarization layer 50 and the pixel defining layer 20 are both thinned, the gradient difference between the two sides of the first groove 14 is relative large, the blocking effect is good, and meanwhile, the first groove 14 can have a certain depth, so that the metal particles 17 entering the first groove 14 are prevented from being flushed back into the left display region 11. Certainly, to simplify the manufacturing process, one of the planarization layer 50 and the pixel defining layer 20 may be thinned. Alternatively, both portions of the gate insulating layer 30 and the interlayer insulating layer 40 in the first spacer region 15 are thinned or completely removed.

Figure 5:
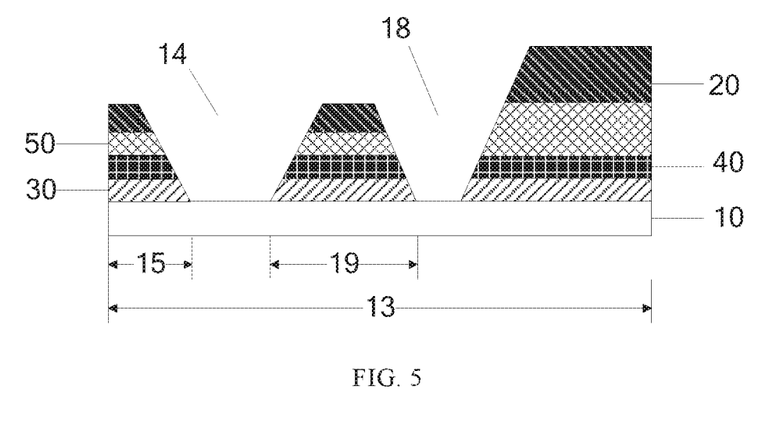
FIG. 5 is a schematic longitudinal cross-sectional view of a blocking region of a display substrate motherboard according to an embodiment of the present disclosure.

FIG. 5 is a schematic longitudinal cross-sectional view of a blocking region of a display substrate motherboard according to an embodiment of the present disclosure, as shown in FIG. 5, in the blocking region, a second groove 18 is further disposed in the display structure layer, and the second groove 18 is located between the first groove 14 and the adjacent display region 11 on the right side in the first direction.

In a specific implementation, a portion of the display structure layer between the second groove 18 and the first groove 14 forms a second spacer region, and the thickness of the portion of the display structure layer in the first spacer region 15 is the same as that in the second spacer region.

In an embodiment, the cross-sectional areas of the first groove 14 and the second groove 18 decrease gradually in a direction towards the base substrate 10.

Specifically, as shown in FIG. 5, the second groove 18 is further arranged on the right side of the first groove 14, a size of the opening of the second groove 18 along the first direction is controlled to range from 100 μm to 110 μm, the portions of the display structure layer in the first spacer region 15 and the second spacer region are the same in thickness, and each of the cross sections of the first groove 14 and the second groove 18 is in an inverted trapezium shape with a wide top and a narrow bottom.

Figure 6:
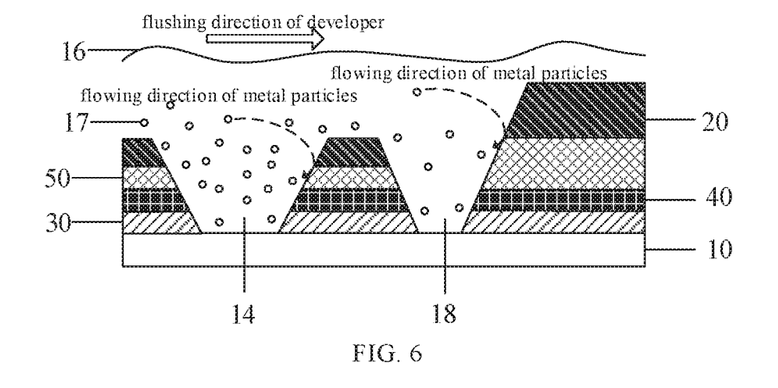
FIG. 6 is another schematic diagram showing blocking metal particles of the display substrate motherboard according to an embodiment of the present disclosure.

In summary, FIG. 6 is another schematic diagram showing blocking metal particles of the display substrate motherboard according to an embodiment of the present disclosure, and as shown in FIG. 6 and FIG. 1, with the further provided second groove 18, metal particles 17 that fail to be blocked by the first groove 14 are blocked, so that an effect of blocking the metal particles 17 is improved.

An embodiment of the present disclosure further provides a display panel motherboard, which includes the above display substrate motherboard.

Figure 7:
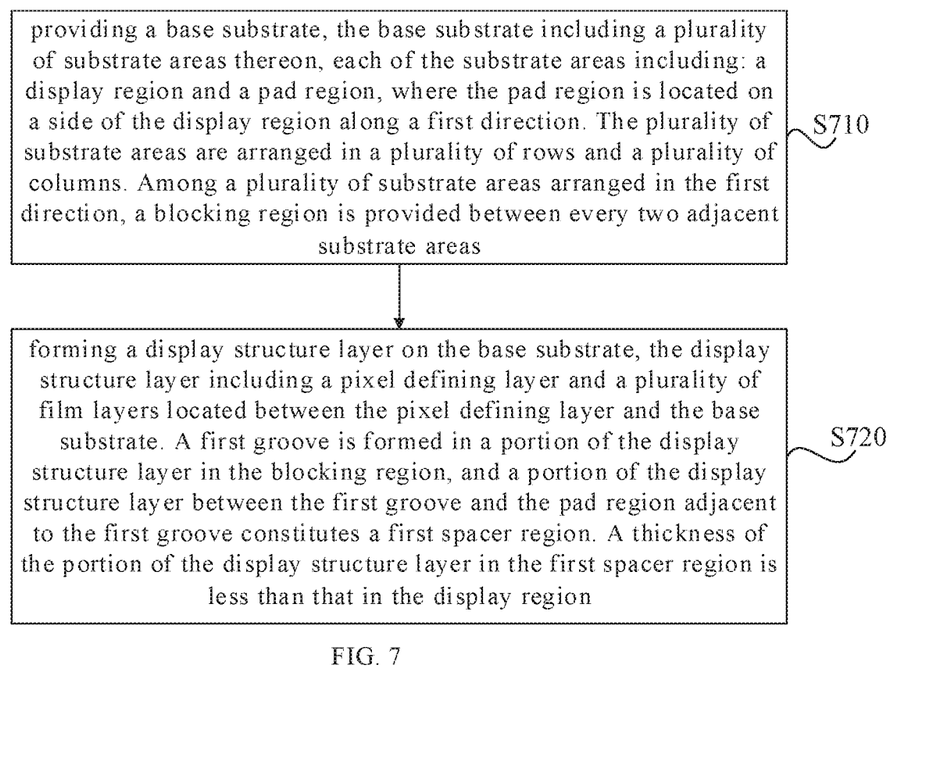
FIG. 7 is a flowchart of a manufacturing method of a display substrate motherboard according to an embodiment of the present disclosure.

An embodiment of the present disclosure further provides a manufacturing method of a display substrate motherboard, and FIG. 7 is a flowchart of the manufacturing method of the display substrate motherboard according to an embodiment of the present disclosure, as shown in FIG. 7, the manufacturing method includes steps S710 and S720 described below.

In step S710, providing a base substrate, the base substrate including a plurality of substrate areas thereon, each of the substrate areas including: a display region and a pad region, where the pad region is located on a side of the display region along a first direction. The plurality of substrate areas are arranged in a plurality of rows and a plurality of columns. Among a plurality of substrate areas arranged in the first direction, a blocking region is provided between every two adjacent substrate areas.

Specifically, the base substrate 10 may be a transparent base substrate, and specifically, may be a base substrate made of a light-guiding and non-metallic material having a certain hardness, such as glass, quartz, or transparent resin.

In step S720, forming a display structure layer on the base substrate, the display structure layer including a pixel defining layer and a plurality of film layers located between the pixel defining layer and the base substrate. A first groove is formed in a portion of the display structure layer in the blocking region, and a portion of the display structure layer between the first groove and the pad region adjacent to the first groove constitutes a first spacer region. A thickness of the portion of the display structure layer in the first spacer region is less than that in the display region.

Specifically, the step of forming the pixel defining layer includes: forming a pixel defining material layer; after the pixel defining material layer is formed, the pixel defining material layer is exposed through a mask plate having different light transmittances. Specifically, the mask plate includes a first mask portion corresponding to the first spacer region, a second mask portion corresponding to the first groove, and a third mask portion corresponding to the display region, where the light transmittance of the first mask portion is different from the light transmittance of other portions of the mask plate, and is determined depending on the photoresist characteristics of the pixel defining material. In response to that the pixel defining material layer is a positive photoresist material, the light transmittance of the first mask portion is less than that of the second mask portion and larger than that of the third mask portion, and in response to that the pixel defining material layer is a negative photoresist material, the light transmittance of the first mask portion is greater than that of the second mask portion and less than that of the third mask portion.

It should be noted that, since the display structure layer further includes a plurality of film layers, in the embodiment of the present disclosure, any other film layer (for example, the planarization layer) of the portion of the display structure layer in the first spacer region may further be thinned in the above manner.

By adopting the display substrate motherboard according to the embodiment of the present disclosure, when the metal particles 17 are flushed by the developer 16 to flow, the metal particles 17 are flushed from a side where the thickness of the portion of the display structure layer is relative small to a side where the thickness of the portion of the display structure layer is relative large, and since there is a gradient difference between the portion of the display structure layer in the first spacer region and the portion of the display structure layer in the display region, the flow of the metal particles 17 is blocked by a side wall of the portion of the display structure layer with relative large thickness, and the metal particles fall into the first groove 14 due to the action of gravity, so that the metal particles 17 are blocked and are prevented from entering the display region 11 of the base substrate 10, and a dark spot defect is avoided, thereby improving the uniformity of display in the display region 11.

Figure 8:
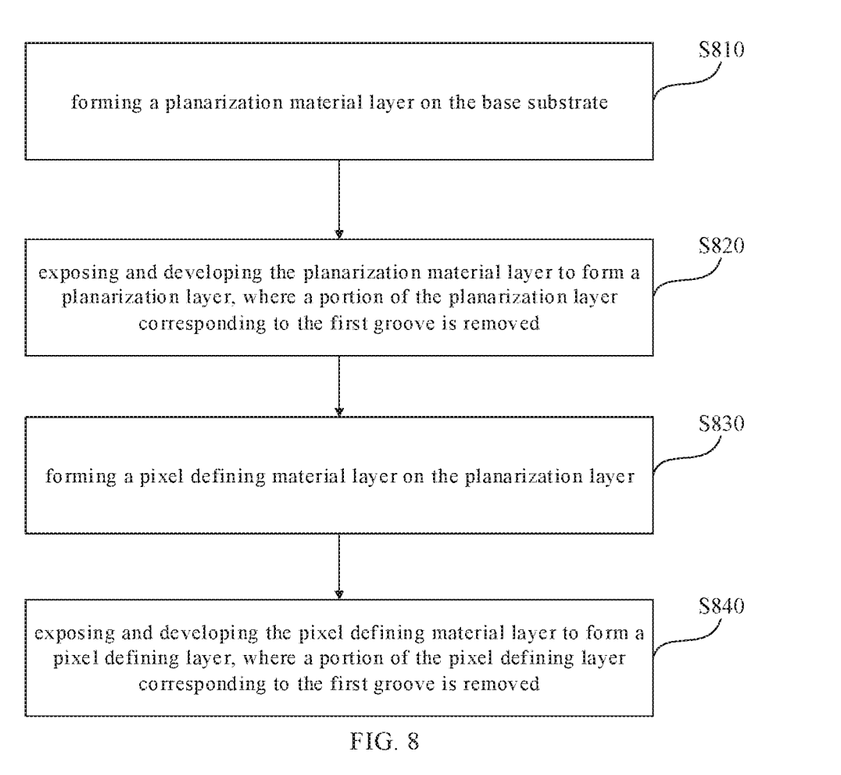
FIG. 8 is a flowchart of a manufacturing method of a display structure layer according to an embodiment of the present disclosure.

FIG. 8 is a flowchart of a manufacturing method of a display structure layer according to an embodiment of the present disclosure, and as shown in FIG. 8, the step of manufacturing the display structure layer includes steps of:

S810, forming a planarization material layer on the base substrate;

S820, exposing and developing the planarization material layer to form a planarization layer, where a portion of the planarization layer corresponding to the first groove is removed;

S830, forming a pixel defining material layer on the planarization layer;

S840, exposing and developing the pixel defining material layer to form a pixel defining layer, where a portion of the pixel defining layer corresponding to the first groove is removed.

A thickness of a portion of the planarization layer in the first spacer region is less than that of the planarization layer in the display region, and/or a thickness of the portion of the pixel defining layer in the first spacer region is less than that of the pixel defining layer in the display region.

Specifically, in step S820, the planarization material layer is exposed by using a mask plate having different light transmittances and developed, resulting in a planarization layer having the first groove, and the thickness of the portion of the planarization layer in the first spacer region is less than that of the planarization layer in the display region.

The pixel defining material layer is formed on the side of the planarization layer away from the base substrate, and the thickness of the portion of the pixel defining layer in the first spacer region is controlled to be less than that of the pixel defining layer in the display region through the above step S840.

It should be noted that, in the embodiment of the present disclosure, both portions of the planarization layer and the pixel defining layer in the first spacer region may be thinned, or one of portions of the planarization layer and the pixel defining layer in the first spacer region may be selected to be thinned.

Figure 9:
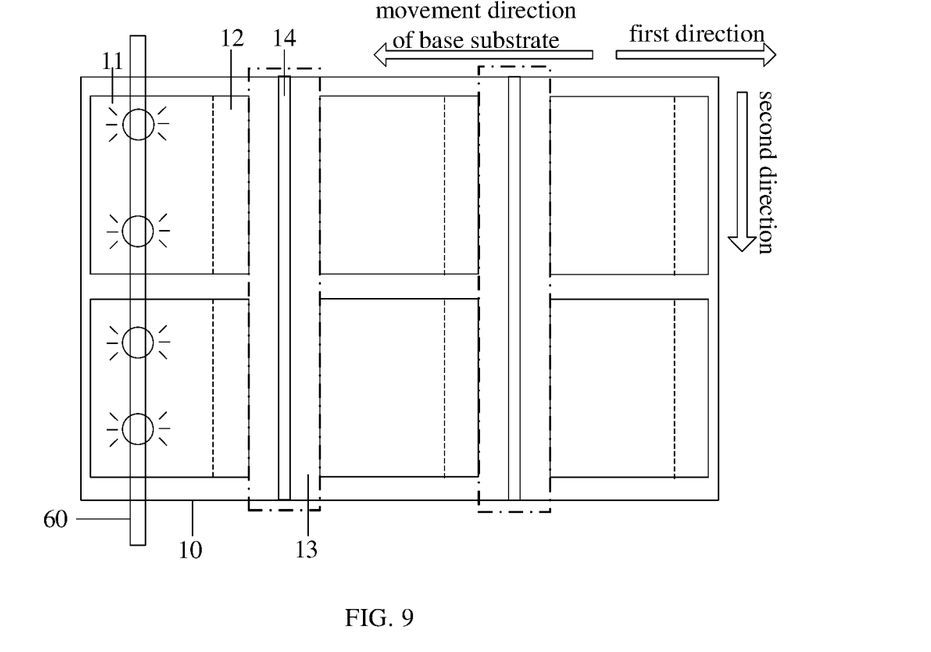
FIG. 9 is a schematic diagram showing a developer spraying operation according to an embodiment of the present disclosure.

FIG. 9 is a schematic diagram showing a developer spraying operation according to an embodiment of the present disclosure, and as shown in FIG. 9, in the process of developing the pixel defining material layer, the developer is sprayed, and a spraying device 60 is moved relative to the base substrate along the first direction.

Specifically, the manner in which the shower device 60 moves relative to the base substrate along the first direction includes: the base substrate is kept stationary and the spraying device 60 moves in the same direction as the first direction; alternatively, the spraying device 60 is kept stationary and the base substrate is moved in a direction opposite to the first direction.

In a specific implementation, the display region and the blocking region at least partially overlap in the first direction, and an orthographic projection of the first groove on the base substrate traverses the blocking region in a second direction, the second direction being perpendicular to the first direction.

The manufacturing method further includes the following step of: after the display structure layer is formed on the base substrate, flushing the first groove in the second direction.

In a specific implementation, a second groove is formed in the display structure layer, and the second groove is located between the first groove and the display region adjacent to the first groove in the first direction.

Figure 10:
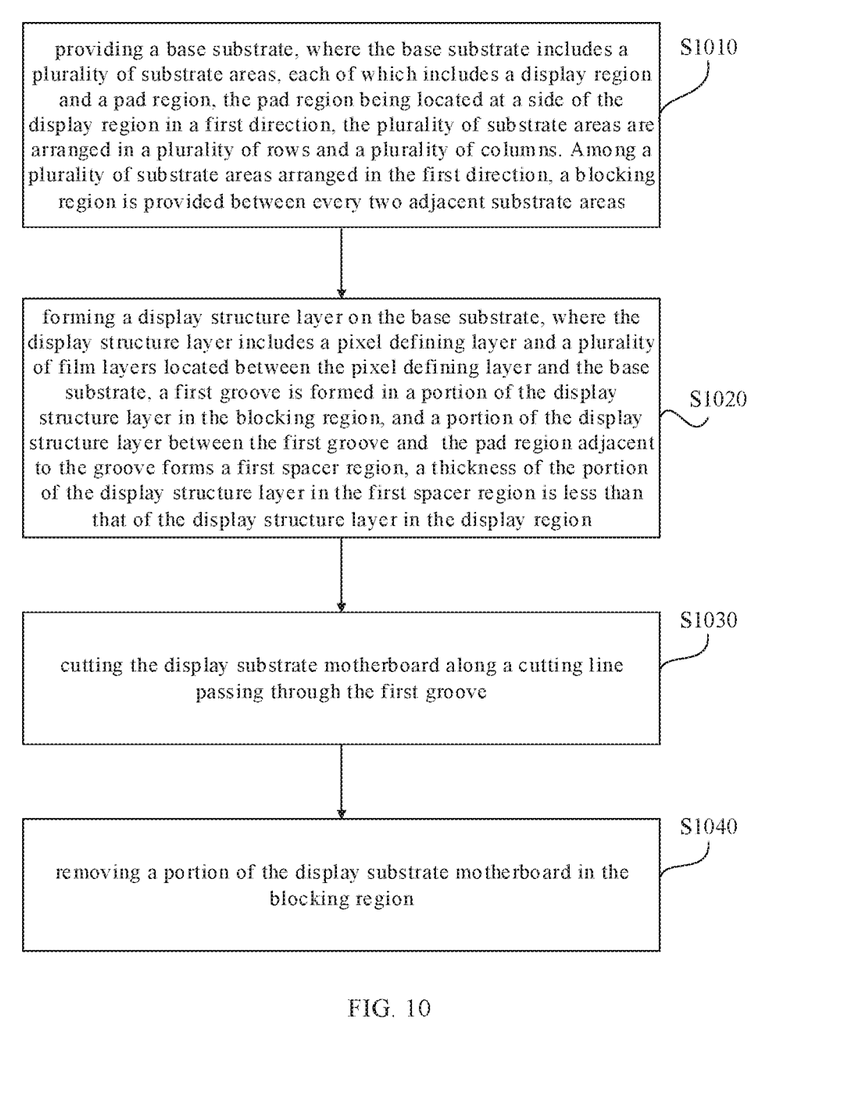
FIG. 10 is a flowchart of a manufacturing method of a display substrate according to an embodiment of the present disclosure.

An embodiment of the present disclosure further provides a manufacturing method of a display substrate, and FIG. 10 is a flowchart of a manufacturing method of a display substrate according to an embodiment of the present disclosure, and as shown in FIG. 10, the manufacturing method includes steps of:

Step S1010, providing a base substrate, where the base substrate includes a plurality of substrate areas, each of which includes a display region and a pad region, the pad region being located at a side of the display region in a first direction, the plurality of substrate areas are arranged in a plurality of rows and a plurality of columns. Among a plurality of substrate areas arranged in the first direction, a blocking region is provided between every two adjacent substrate areas;

Step S1020, forming a display structure layer on the base substrate, where the display structure layer includes a pixel defining layer and a plurality of film layers located between the pixel defining layer and the base substrate, a first groove is formed in a portion of the display structure layer in the blocking region, and a portion of the display structure layer between the first groove and the pad region adjacent to the groove forms a first spacer region, a thickness of the portion of the display structure layer in the first spacer region is less than that of the display structure layer in the display region;

Step 1030, cutting the display substrate motherboard along a cutting line passing through the first groove; and Step S1040, removing a portion of the display substrate motherboard in the blocking region.

Specifically, the first groove may extend along the second direction, and the cutting line may pass through the first groove along the extending direction of the first groove and may be located in the center of the first groove. When the display substrate motherboard is cut, the display substrate motherboard is separated into a plurality of initial display substrates by a first cutting (rough cutting) along the cutting line, then, each initial display substrate is cut by a second cutting (fine cutting) to remove residual invalid regions of each initial display substrate, and the blocking region can be cut off at the same time by controlling the cutting range during the second cutting, so that metal particles in the blocking region are removed.

In the process of manufacturing the display substrate by using the manufacturing method in the embodiment, when other structure layers are manufactured, by flushing with the developer in the processes of developing and the like, the metal particles are flushed by the developer to flow, and since the thickness of the portion of the display structure layer in the first spacer region is less than that of the display structure layer in the display region, the flow of the metal particles is blocked by the side wall of the portion of the display structure layer with relative large thickness and the metal particles fall into the first groove under the action of gravity, the metal particles are blocked, therefore the metal particles are prevented from entering the display region of the base substrate, the defect of dark spots on the manufactured display substrate is avoided, and the uniformity of display of the display substrate is improved.

It should be understood that the above embodiments are merely exemplary embodiments employed for illustrating the principles of the technical solutions of the present disclosure, and the present disclosure is not limited thereto. It will be apparent to those skilled in the art that various changes and modifications can be made therein without departing from the spirit of the disclosure, and these changes and modifications should be construed as falling within the scope of the disclosure.

What is claimed is:

1. A display substrate motherboard, comprising:
   a base substrate comprising a plurality of substrate areas, each substrate area comprising a display region and a pad region, wherein the pad region is located on a side of the display region along a first direction;
   a display structure layer located on the base substrate and comprising a pixel defining layer and a plurality of film layers located between the pixel defining layer and the base substrate, wherein
   a blocking region is arranged between any two substrate areas that are adjacent to each other along the first direction;
   a portion of the display structure layer in the blocking region has a first groove therein, and a portion of the display structure layer between the first groove and the pad region adjacent to the first groove constitutes a first spacer region; and
   a thickness of the portion of the display structure layer in the first spacer region is less than that of a portion of the display structure layer in the display region.

2. The display substrate motherboard of claim 1, wherein the display region at least partially overlaps the blocking region in the first direction, an orthographic projection of the first groove on the base substrate traverses the blocking region in a second direction, the second direction being perpendicular to the first direction.

3. The display substrate motherboard of claim 1, wherein the plurality of film layers comprises a gate insulating layer, an interlayer insulating layer, and a planarization layer, which are sequentially stacked in a direction away from the base substrate, wherein the first groove penetrates the gate insulating layer, the interlayer insulating layer, the planarization layer, and the pixel defining layer.

4. The display substrate motherboard of claim 3, wherein a thickness of a portion of the planarization layer in the first spacer region is less than a thickness of a portion of the planarization layer in the display region, and/or
   a thickness of a portion of the pixel defining layer in the first spacer region is less than a thickness of a portion of the pixel defining layer in the display region.

5. The display substrate motherboard of claim 1, wherein the display structure layer further has a second groove therein, the second groove being located between the first groove and the display region adjacent to the first groove in the first direction.

6. The display substrate motherboard of claim 5, wherein a portion of the display structure layer between the second groove and the first groove constitutes a second spacer region, and a thickness of the portion of the display structure layer in the first spacer region is the same as a thickness of a portion of the display structure layer in the second spacer region.

7. The display substrate motherboard of claim 5, wherein cross-sectional areas of the first groove and the second groove gradually decrease in a direction towards the base substrate.

8. A display panel motherboard, comprising the display substrate motherboard of claim 1.

9. A manufacturing method of a display substrate motherboard, comprising:
- providing a base substrate, wherein the base substrate comprises a plurality of substrate areas, each of the substrate areas comprises a display region and a pad region, the pad region is located on a side of the display region along a first direction, among a plurality of substrate areas arranged in the first direction, a blocking region is provided between every two adjacent substrate areas;
- forming a display structure layer on the base substrate, wherein the display structure layer comprises a pixel defining layer and a plurality of film layers located between the pixel defining layer and the base substrate; a first groove is formed in a portion of the display structure layer in the blocking region, a portion of the display structure layer between the first groove and the pad region adjacent to the first groove constitutes a first spacer region; a thickness of the portion of the display structure layer in the first spacer region is less than a thickness of a portion of the display structure layer in the display region.

10. The manufacturing method of claim 9, wherein manufacturing the display structure layer comprises:
- forming a planarization material layer on the base substrate;
- exposing and developing the planarization material layer to form a planarization layer, a portion of the planarization layer corresponding to the first groove is removed;
- forming a pixel defining material layer on the planarization layer;
- exposing and developing the pixel defining material layer to form the pixel defining layer, a portion of the pixel defining layer corresponding to the first groove is removed;
- wherein a thickness of the portion of the planarization layer in the first spacer region is less than a thickness of a portion of the planarization layer in the display region, and/or
- a thickness of the portion of the pixel defining layer in the first spacer region is less than a thickness of a portion of the pixel defining layer in the display region.

11. The manufacturing method of claim 10, wherein developing the pixel defining material layer is performed by spraying developer through a spraying device which is moved relative to the base substrate in the first direction.

12. The manufacturing method of claim 9, wherein the blocking region at least partially overlaps the display region adjacent to the blocking region in the first direction, an orthographic projection of the first groove on the base substrate traverses the blocking region in a second direction, the second direction being perpendicular to the first direction;
the manufacturing method further comprises:
- after forming the display structure layer on the base substrate, flushing the first groove along the second direction.

13. The manufacturing method of claim 9, further comprising: forming a second groove in the display structure layer, the second groove being located between the first groove and the display region adjacent to the first groove in the first direction.

14. A manufacturing method of a display substrate, comprising:
- manufacturing a display substrate motherboard by using the manufacturing method of claim 9;
- cutting the display substrate motherboard along a cutting line passing through the first groove; and
- removing a portion of the display substrate motherboard located in the blocking region.

* * * * *